United States Patent
Chen et al.

(10) Patent No.: US 6,411,485 B1
(45) Date of Patent: Jun. 25, 2002

(54) ELECTROSTATIC DISCHARGE PROTECTION CIRCUIT FOR MULTI-VOLTAGE POWER SUPPLY CIRCUIT

(75) Inventors: Shiao-Shien Chen, Tao-Yuan Hsien; Tien-Hao Tang, Taipei Hsien, both of (TW)

(73) Assignee: United Microelectrics Corp., Hsinchu (TW)

( * ) Notice: Subject to any disclaimer, the term of this patent is extended or adjusted under 35 U.S.C. 154(b) by 0 days.

(21) Appl. No.: 09/433,996

(22) Filed: Nov. 4, 1999

(51) Int. Cl.[7] .............................................. H02H 9/00
(52) U.S. Cl. ........................... 361/111; 361/56; 361/58; 361/119
(58) Field of Search ........................ 361/56, 58, 111, 361/117, 118, 119, 127, 115; 257/173, 355, 362; 327/310, 313, 318, 327, 328, 534

(56) References Cited

U.S. PATENT DOCUMENTS

| | | | | |
|---|---|---|---|---|
| 5,400,202 A | * | 3/1995 | Metz et al. ................... 361/56 |
| 5,541,801 A | * | 7/1996 | Lee et al. ..................... 361/56 |
| 5,721,656 A | * | 2/1998 | Wu et al. ..................... 361/56 |
| 5,869,873 A | * | 2/1999 | Yu ............................... 257/362 |
| 5,917,689 A | * | 6/1999 | English et al. ............... 361/56 |
| 5,959,820 A | * | 9/1999 | Ker et al. .................... 361/111 |
| 5,986,863 A | * | 11/1999 | Oh .............................. 361/56 |
| 6,069,782 A | * | 5/2000 | Lien et al. ................... 361/111 |
| 6,075,686 A | * | 6/2000 | Ker .............................. 361/56 |

* cited by examiner

Primary Examiner—Stephen W. Jackson (57) ABSTRACT

An ESD (electrostatic discharge) protection circuit is provided, which features a low triggering voltage and a low leakage current and is suitable for use with a multi-voltage power supply circuit to protect the internal circuitry of the multi-voltage power supply circuit against ESD stress. This ESD protection circuit represents a solution to the problem of a thinning oxide structure in a downsized IC device that would be no longer able to withstand large ESD-induced transient current. This ESD protection circuit is not only suitable for use with 0.18 μm technology, but also suitable for use with 0.15 μm or 0.13 μm technology, and nevertheless can provide a robust ESD protection capability to the multi-voltage power supply circuit.

31 Claims, 9 Drawing Sheets

ELECTROSTATIC DISCHARGE PROTECTION CIRCUIT FOR MULTI-VOLTAGE POWER SUPPLY CIRCUIT

BACKGROUND OF THE INVENTION

1. Field of the Invention

This invention relates to integrated circuit (IC) technology, and more particularly, an ESD (electrostatic discharge) protection circuit with a low triggering voltage and a low leakage current, which is designed for use with a multi-voltage power supply circuit to protect the internal circuitry of the multi-voltage power supply circuit against ESD stress.

2. Description of Related Art

Electrostatic discharge (ESD) is a movement of static electricity from a nonconductive surface, which can easily cause damage to IC devices such as DRAMs and SRAMs during both manufacture and operation. A person walking on a carpet, for instance, can carry an amount of electrostatic charge up to several thousands of volts under high relative humidity (RH) conditions and over 10,000 volts under low RH conditions. If such a person touches an IC package, the electrostaticity on his/her body would be instantly discharged to the IC package, thus causing ESD damage to the internal circuitry of the IC package. A widely used solution to this problem is to provide an on-chip ESD protection circuit between each neighboring pair of I/O pads on the internal circuitry of the IC package.

One drawback to the prior art, however, is that when the IC device is fabricated at a downsized level of integration, such as the deep-submicron level, the gate-oxide structure will be reduced in thickness. This would cause the breakdown voltage of the gate-oxide structure to become close to or below the breakdown voltage at the source/drain junction, thus degrading the ESD protection capability. The internal circuitry of an IC device is typically designed in accordance with the Minimum Design Rules. Therefore, the various semiconductor components of an IC device are designed to the minimum size. This practice, however, would make some components vulnerable to ESD-induced transient current, such as the edges of the areas extending from the contact windows to the diffusion areas and the areas from the contact windows to the gates, when these components are further downsized. For this reason, a highly-integrated IC device fabricated at the deep-submicron level of integration is particularly vulnerable to ESD. Therefore, in the IC industry, much research effort has been directed to ESD protection in integrated circuitry.

Figure 1A:
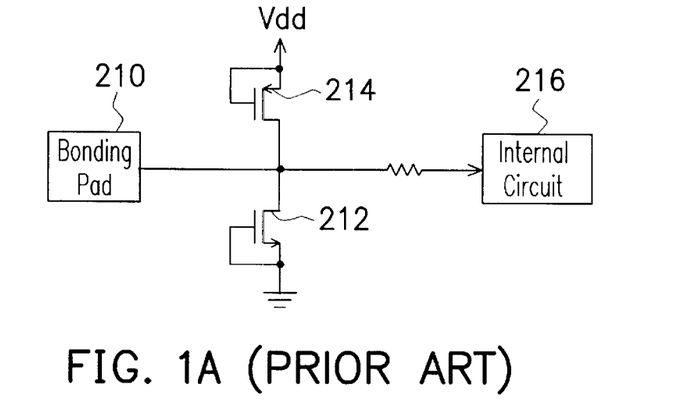
FIGS. 1A–1C (PRIOR ART) are schematic diagrams each showing the circuit configuration of a conventional ESD protection circuit.
Figure 1B:
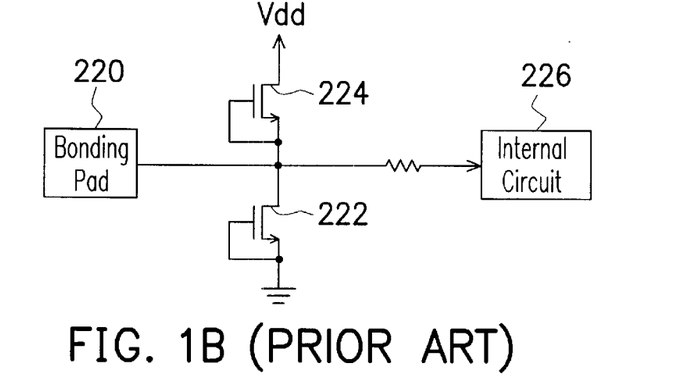
Figure 1C:
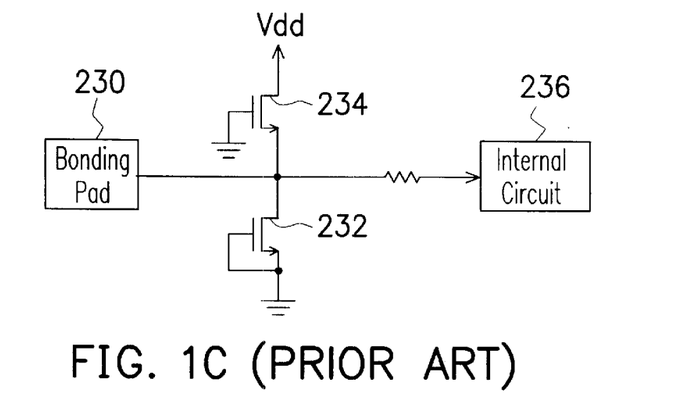

FIGS. 1A–1C are schematic diagrams each showing the circuit configuration of a conventional ESD protection circuit.

FIG. 1A is a schematic diagram showing the circuit configuration of a first conventional ESD protection circuit. As shown, this ESD protection circuit is coupled between the internal circuitry 216 and a bonding pad 210 of an IC device, and which is composed of a NMOS transistor 212 and an PMOS transistor 214. The NMOS transistor 212 is connected in such a manner that its drain is connected to the bonding pad 210; its source is connected to the ground; and its gate is also connected to the ground. The PMOS transistor 214 is connected in such a manner that its drain is connected to the bonding pad 210; its source is connected to a system voltage line VDD; and its gate is also connected to the system voltage line VDD. When ESD occurs at the bonding pad 210, the ESD-induced transient current can be diverted via the NMOS transistor 212 to the ground and also via the PMOS transistor 214 to the system voltage line VDD without flowing into the internal circuitry 216.

FIG. 1B is a schematic diagram showing the circuit configuration of a second conventional ESD protection circuit. As shown, this ESD protection circuit is coupled between the internal circuitry 226 and a bonding pad 220 of an IC device, and which is composed of a pair of NMOS transistors 222, 224. The first NMOS transistor 222 is connected in such a manner that its drain is connected to the bonding pad 220; its source is connected to the ground; and its gate is also connected to the ground. The NMOS transistor 224 is connected in such a manner that its source is connected to the bonding pad 220; its drain is connected to a system voltage line VDD; and its gate is also connected to the bonding pad 220. When ESD occurs at the bonding pad 220, the ESD-induced transient current can be diverted via the first NMOS transistor 222 to the ground and also via the second NMOS transistor 224 to the system voltage line VDD without flowing into the internal circuitry 216.

FIG. 1C is a schematic diagram showing the circuit configuration of a third conventional ESD protection circuit. As shown, this ESD protection circuit is coupled between the internal circuitry 236 and a bonding pad 230 of an IC device, and which is composed of a pair of NMOS transistors 232, 234. This ESD protection circuit differs from the one shown in FIG. 1B only in that here the gate of the second NMOS transistor 234 is connected to the ground rather than to the bonding pad 230. This circuit configuration also can prevent the ESD-induced transient current from the bonding pad 230, if any, from flowing into the internal circuitry 236.

The foregoing three ESD protection circuits all utilize junction breakdown voltage for ESD protection. One drawback to this scheme, however, is that when the IC device is fabricated at a further downsized level of integration, such as the deep-submicron level, the gate-oxide structure will be reduced in thickness, which would cause the gate-oxide structure to be subjected to breakdown prior to the occurrence of the junction breakdown. In this case, the foregoing ESD protection circuits of FIGS. 1A–1C would lose their ESD protection capability.

Therefore, the present design scheme for ESD protection circuit may be unsuitable for use in further-downsized IC devices. For this reason, it is still an research effort in the IC industry for a new ESD protection circuit that can be suited for use with deep-submicron IC technology.

SUMMARY OF THE INVENTION

It is therefore an objective of this invention to provide a new ESD protection circuit, which can be suited for use with deep-submicron IC technology.

In accordance with the foregoing and other objectives, a new ESD protection circuit is proposed. The ESD protection circuit of the invention is designed for use with a multi-voltage power supply circuit having a first internal circuit using a first system voltage and a second internal circuit using a second system voltage, with the first internal circuit having a first set of bonding pads and the second internal circuit having a second set of bonding pads. The ESD protection circuit of the invention comprises: (a) a first ESD bus; (b) a first set of ESD protection units each being coupled between the first ESD bus and one of the first set of bonding pads of the multi-voltage power supply circuit, and each of which is capable of being switched on in the event of an ESD stress to the associated one of the first set of bonding pads; (c) a second ESD bus; (d) a second set of ESD protection units each being coupled between the second ESD bus and one of the second set of bonding pads of the multi-voltage power supply circuit, and each of which is capable of being switched on in the event of an ESD stress to the associated one of the second set of bonding pads; and (e) a routing circuit coupled between the first ESD bus and the second ESD bus, which allows an ESD-induced transient current in the first ESD bus to flow to the second ESD bus and an ESD-induced transient current in the second ESD bus to flow to the first ESD bus.

Each of the ESD protection units comprises: (a) a first resistor having a first end and a second end, with the first end being connected to the associated bonding pad; (b) a second resistor having a first end and a second end, with the first end being connected to the associated ESD bus; (c) a PNP transistor whose base is connected to the second end of the first resistor, whose emitter is connected to the bonding pad, and whose collector is connected to the second end of the second resistor; (d) an NPN transistor whose base is connected to the second end of the second resistor, whose collector is connected to the second end of the first resistor, and whose emitter is connected to the ESD bus; and (e) a first set of PMOS transistors which are connected in such a manner that each of which except the first one is connected in such a manner that its source is connected to the drain of the previous PMOS transistor; its drain is connected to the source of the next PMOS transistor; its gate is tied to its drain; and its substrate is tied to its source; while the first PMOS transistor is connected in such a manner that its source is connected to the second end of the first resistor and its substrate is connected to the associated one of the bonding pad; and the last PMOS transistor is connected in such a manner that its drain is connected to the ESD bus.

The foregoing ESD protection circuit of the invention has a low triggering voltage and a low leakage current that allows it to be suitable for use with the multi-voltage power supply circuit to protect the internal circuitry of the multi-voltage power supply circuit against ESD stress. The invention is not only suitable for use with 0.18 $\mu$m technology, but also suitable for use with 0.15 $\mu$m or 0.13 $\mu$m technology, and nevertheless can provide a robust ESD protection capability to the associated IC device.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a novel ESD protection circuit with a low triggering voltage and a low leakage current, which is designed for use with a multi-voltage power supply circuit to protect the internal circuitry of the multi-voltage power supply circuit against ESD stress. The ESD protection circuit of the invention can substitute for the conventional N-P ESD protection circuit.

Figure 2:
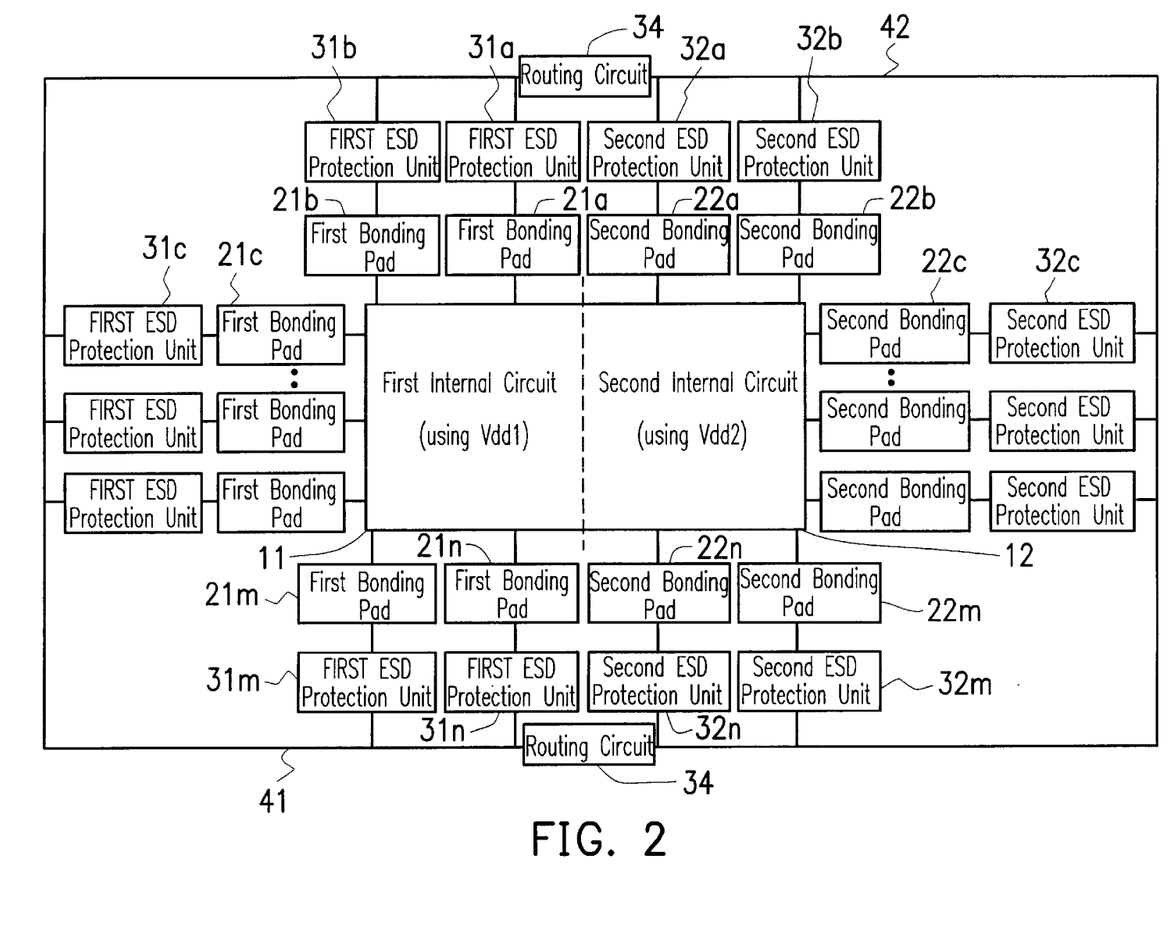
FIG. 2 is a schematic diagram showing the coupling of the ESD protection circuit of the invention to a multi-voltage power supply circuit.

FIG. 2 is a schematic diagram showing the coupling of the ESD protection circuit of the invention to a multi-voltage power supply circuit. As shown, the multi-voltage power supply circuit includes a first internal circuit 11 having a first set of bonding pads 21a, 21b, . . . , 21n and a second internal circuit 12 having a second set of bonding pads 22a, 22b, . . . , 22n, with the first internal circuit 11 using a first system voltage $V_{dd1}$ and the second internal circuit 12 using a second system voltage $V_{dd2}$. The first set of bonding pads 21a, 21b, . . . , 21n and the second set of bonding pads 22a, 22b, . . . , 22n are each an I/O pad, a power supply pad $V_{dd}$, or a grounding pad $V_{ss}$. The ESD protection circuit of the invention includes a first ESD bus 41, a second ESD bus 42, a first set of ESD protection units 31a, 31b, . . . , 31n, a second set of ESD protection units 32a, 32b, . . . , 32n, and a pair of routing circuits 34. The first set of ESD protection units 31a, 31b, . . . , 31n are each coupled between the first ESD bus 41 and one of the first set of bonding pads 21a, 21b, . . . , 21n; while the second set of ESD protection units 32a, 32b, . . . , 32n are each coupled between the second ESD bus 42 and one of the second set of bonding pads 22a, 22b, . . . , 22n. Further, the routing circuits 34 are coupled between the first ESD bus 41 and the second ESD bus 42.

The first set of bonding pads 21a, 21b, . . . , 21n are associated with the first internal circuit 11, and each of which is connected to one of the first set of ESD protection units 31a, 31b, . . . , 31n. The second set of bonding pads 22a, 22b, . . . , 22n are associated with the second internal circuit 12, and each of which is connected to one of the second set of bonding pads 22a, 22b, . . . , 22n. Further, the first set of ESD protection units 31a, 31b, . . . , 31n are all connected to the first ESD bus 41, while the second set of ESD protection units 32a, 32b, . . . , 32n are all connected to the second ESD bus 42. When an ESD stress occurs at any one of the first set of bonding pads 21a, 21b, . . . , 21n, the ESD-induced transient current can be drained via the first set of ESD protection units 31a, 31b, . . . , 31n to the first ESD bus 41; and similarly, when an ESD stress occurs at any one of the second set of bonding pads 22a, 22b, . . . , 22n, the ESD-induced transient current can be drained via the second set of ESD protection units 32a, 32b, . . . , 32n to the second ESD bus 42.

Figure 3A:
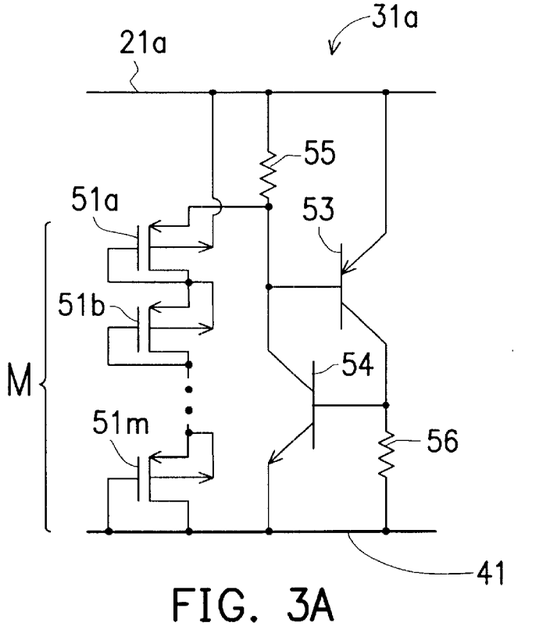
FIG. 3A is a schematic diagram showing the inside circuit structure of each of the first set of ESD protection units.

FIG. 3A is a schematic diagram showing the circuit configuration of each of the first set of ESD protection units 31a, 31b, ..., 31n (since these ESD protection units are all identical in circuit configuration, only the first one 31a is shown). As shown, the ESD protection unit 31a is composed of M PMOS transistors 51a, 51b, ..., 51m (where M is a predetermined number), a PNP transistor 53, an NPN transistor 54, a first resistor 55, and a second resistor 56. The combined structure of the PNP transistor 53 and the NPN transistor 54 is functionally equivalent to a silicon-controlled rectifier (SCR). The first and second resistors 55, 56 are both used as current-limiting means.

Each of the PMOS transistors 51a, 51b, ..., 51m except the first one 51a are connected in such a manner its source is connected to the drain of the previous PMOS transistor; its drain is connected to the source of the next PMOS transistor; its gate is tied to its drain; and its substrate is tied to its source. For the first PMOS transistor 51a, its source is connected to one end of the first resistor 55 and its substrate is connected to the associated bonding pad 21a; and for the last PMOS transistor 51m, its drain is connected to the first ESD bus 41. The first resistor 55 has a first end and a second end, with the first end being connected to the associated bonding pad 21a. The second resistor 56 has a first end and a second end, with the first end connected to the first ESD bus 41. The PNP transistor 53 is connected in such a manner that its emitter is connected to the associated bonding pad 21a; its base is connected the second end of the first resistor 55; and its collector is connected to the second end of the second resistor 56. The NPN transistor 54 is connected in such a manner that its collector is connected to the second end of the first resistor 55; its base is connected to the second end of the second resistor 56; and its emitter is connected to the first ESD bus 41.

Figure 3B:
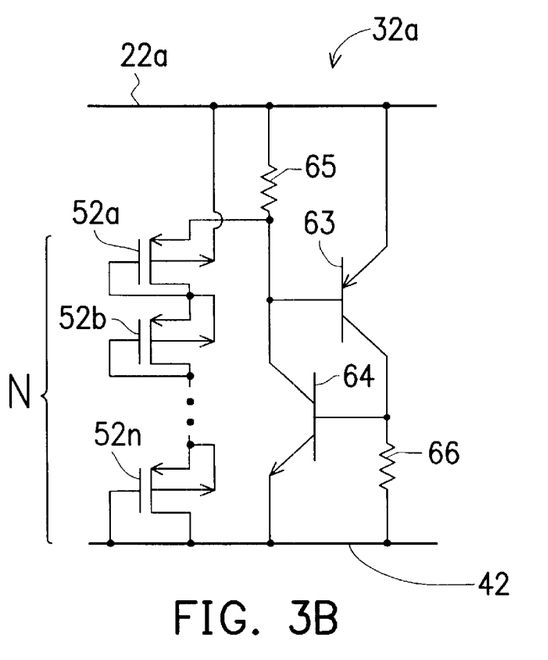
FIG. 3B is a schematic diagram showing the inside circuit structure of each of the second set of ESD protection units.

FIG. 3B is a schematic diagram showing the circuit configuration of each of the second set of ESD protection units 32a, 32b, ..., 32n (since these ESD protection units are all identical in circuit configuration, only the first one 32a is shown). As shown, the ESD protection unit 32a is composed of N of PMOS transistors 52a, 52b, ..., 52n (where N is a predetermined number), a PNP transistor 63, an NPN transistor 64, a first resistor 65, and a second resistor 66. This ESD protection unit 32a is substantially identical in circuit configuration as the ESD protection unit 31a shown in FIG. 3A except that the total number (i.e., N) of the PMOS transistors 52a, 52b, ..., 52n may be different from the total number (i.e., M) of the PMOS transistors 51a, 51b, ..., 51m in the ESD protection unit 31a of FIG. 3A.

Figure 4A:
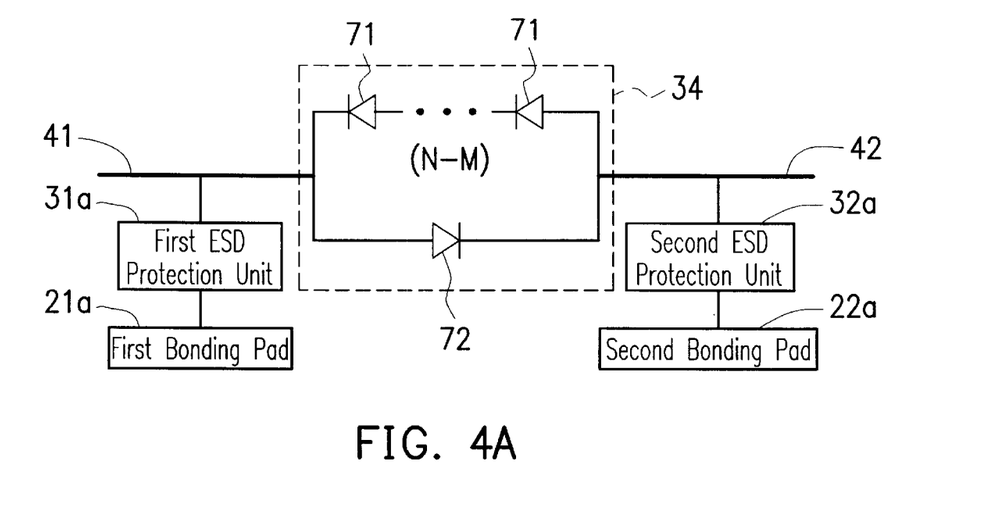
FIG. 4A is a schematic diagram showing the inside circuit structure of each of the routing circuits when M<N.
Figure 4B:
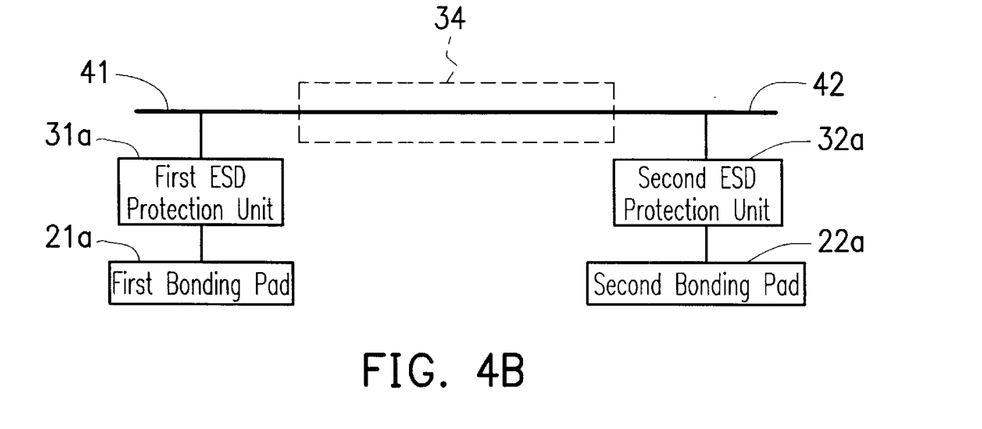
FIG. 4B is a schematic diagram showing the inside circuit structure of each of the routing circuits when M=N.

FIG. 4A is a schematic diagram showing the inside circuit structure of each of the routing circuits when M<N; while FIG. 4B is a schematic diagram showing the inside circuit structure of each of the routing circuits when M=N.

The values of M and N are dependent on the magnitudes of $V_{dd1}$ and $V_{dd2}$. For instance, if $V_{dd2} > V_{dd1}$, then it is required that M<N.

Referring to FIG. 4A, in the case of M<N, each routing circuit 34 is composed of a set of (N−M) serially-connected first diodes 71 and a reversely-arranged second diode 72 connected in parallel to the first diodes 71. The first diodes 71 are connected in such a manner that each has its positive end connected to the negative end of the previous one and its negative end connected to the positive end of the next one; and the first one has its positive end connected to the second ESD bus 42 and the last one has its negative end connected to the first ESD bus 41. The second diode 72 is connected in such a manner that its positive end is connected to the first ESD bus 41 and its negative end is connected to the second ESD bus 42. This allows the ESD-induced transient current in the first ESD bus 41, if any, to pass through the second diode 72 to the second ESD bus 42, and the ESD-induced transient current in the second ESD bus 42, if any, to pass through the serially-connected first diodes 71 to the first ESD bus 41.

Referring to FIG. 4B, in the case of M=N, each routing circuit 34 is a short-circuit connected between the first ESD bus 41 and the second ESD bus 42. This allows the ESD-induced transient current in the first ESD bus 41, if any, to flow to the second ESD bus 42, and vice versa.

Figure 4C:
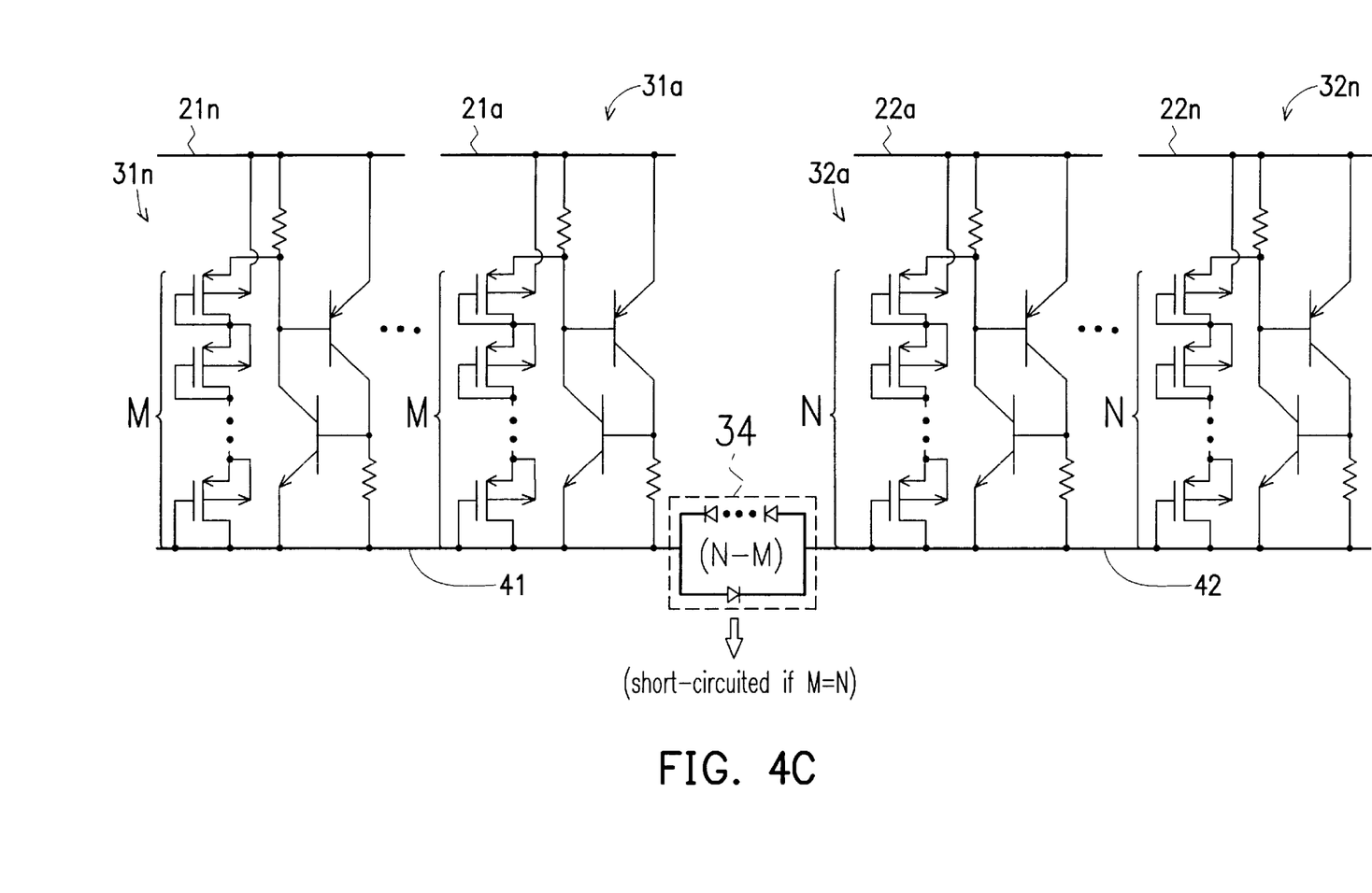
FIG. 4C is a schematic diagram showing the connection of the routing circuit between the first set of ESD protection units and the second set of ESD protection units.

FIG. 4C is a schematic diagram showing the connection of the routing circuit 34 between the first ESD bus 41 coupled to the first set of ESD protection units 31a, 31b, ..., 31n and the second ESD bus 42 coupled to the second set of ESD protection units 32a, 32b, ..., 32n.

In the following analysis, assume that $V_{dd2} \geq V_{dd1}$, then N≥M.

Figure 5A:
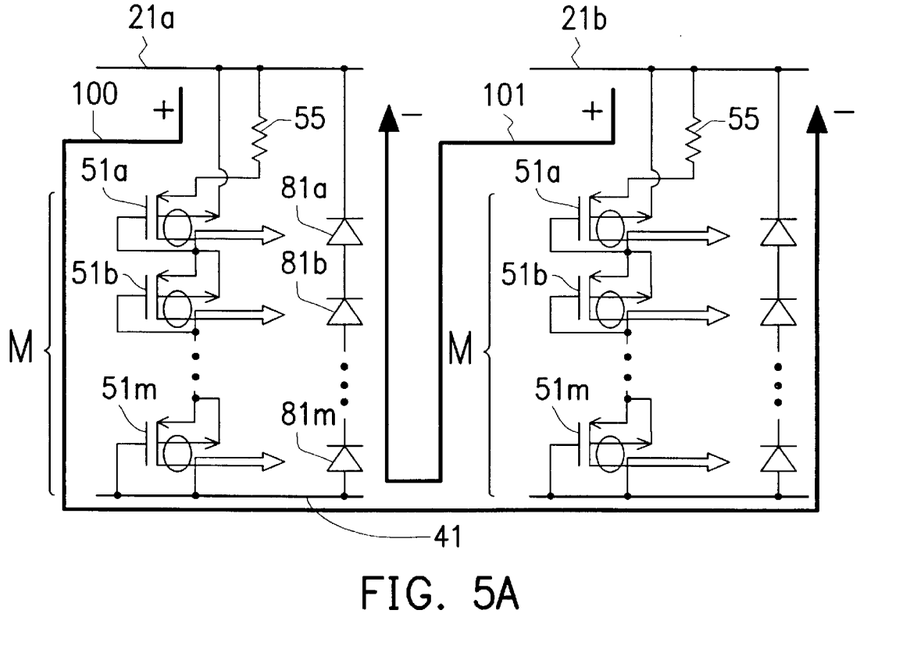
FIGS. 5A–5B are schematic diagrams used to depict how the ESD protection circuit of the invention would handle the condition of an ESD stress between a neighboring pair of the first set of bonding pads.
Figure 5B:
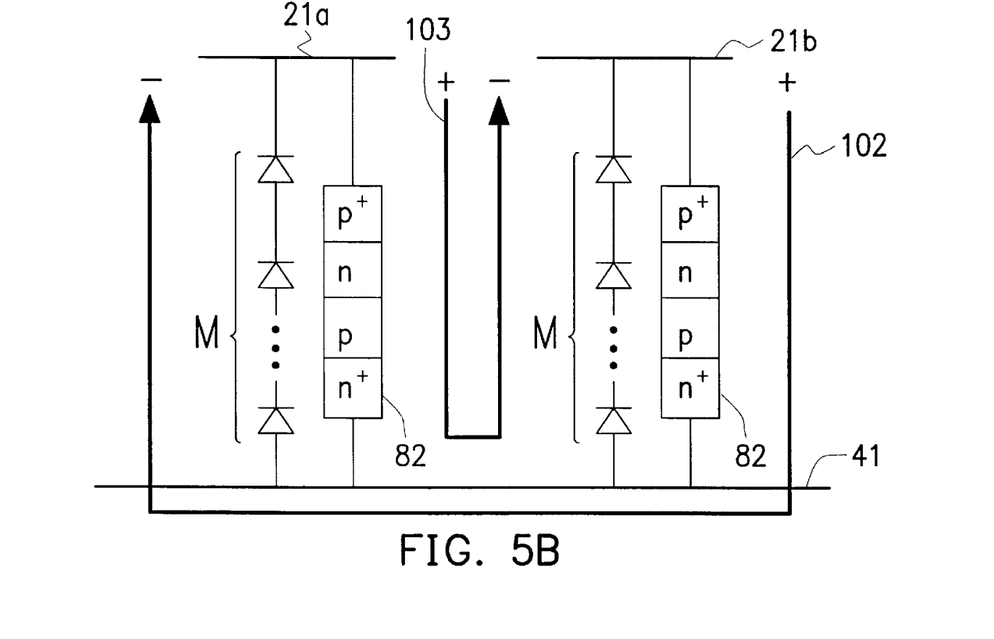

FIGS. 5A–5B are schematic diagrams used to depict how the ESD protection circuit of the invention would handle the condition of an ESD stress between a neighboring pair of the first set of bonding pads 21a, 21b, ..., 21n, for example between the bonding pads 21a and 21b. In FIGS. 5A–5B, the PMOS transistors 51a, 51b, ..., 51m are drawn as a set of serially-connected PN diodes designated by the reference numerals 81a, 81b, ..., 81m in FIG. 5A, herein the parasitic diode is formed by the substrate and the drain junction of PMOS transistor; while the SCR circuit (i.e., the combined circuit structure of the PNP transistor 53 and the NPN transistor 54) is drawn as a $p^+npn^+$ structure designated by the reference numeral 82 in FIG. 5B.

When the $p^+npn^+$-based SCR circuit 82 is in the OFF state, the ESD-induced transient current would flow through the paths indicated by the arrows 100, 101 in FIG. 5A; and when switched ON, the ESD-induced transient current would flow through the paths indicated by the arrows 102, 103 in FIG. 5B.

It can be seen that the path for a positive ESD-induced transient current and the path for a negative ESD-induced transient current are symmetrical. Under the condition of an ESD stress, whether positive or negative, the ESD drainage path will be switched on if the voltage of bonding pads exceeds M·|$V_{tp}$|+M·VD, where $V_{tp}$ is the threshold voltage of the PMOS transistors 51a, 51b, ..., 51m; and VD is the forward bias of the PN diodes 81a, 81b, ..., 81m.

Under normal operating conditions (i.e., when there is no ESD stress), $V_{dd1}$ should be smaller than M·|$V_{tp}$|+M·VD so as to prevent the ESD protection circuit from being switched on. This also allows the ESD protection circuit to have a low leakage current.

Figure 6A:
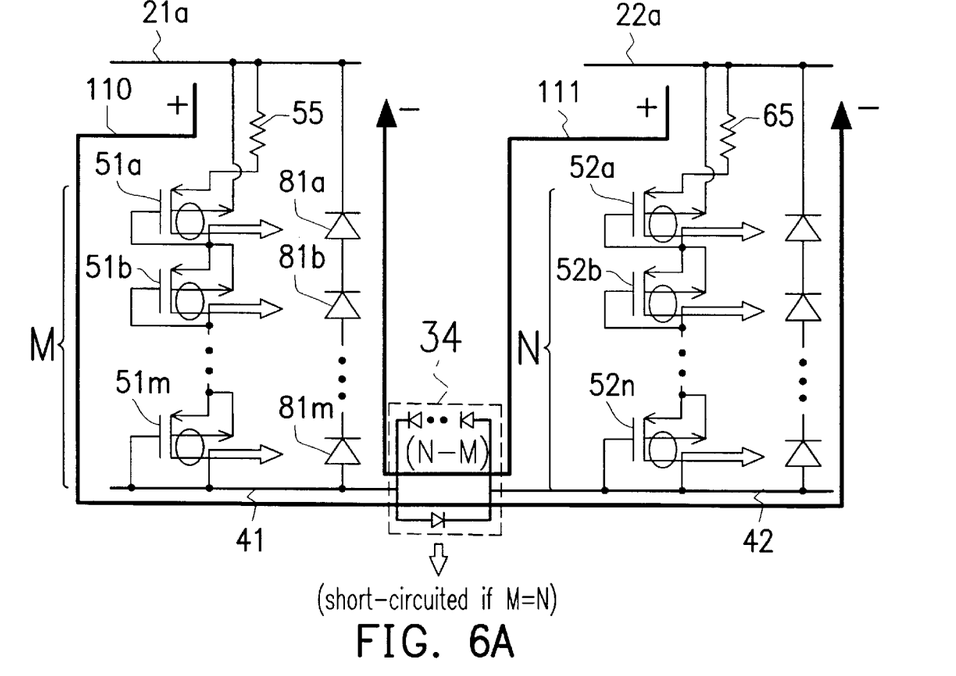
FIGS. 6A–6B are schematic diagrams used to depict how the ESD protection circuit of the invention would handle the condition of an ESD stress between one of the first set of bonding pads and one of the second set of bonding pads.
Figure 6B:
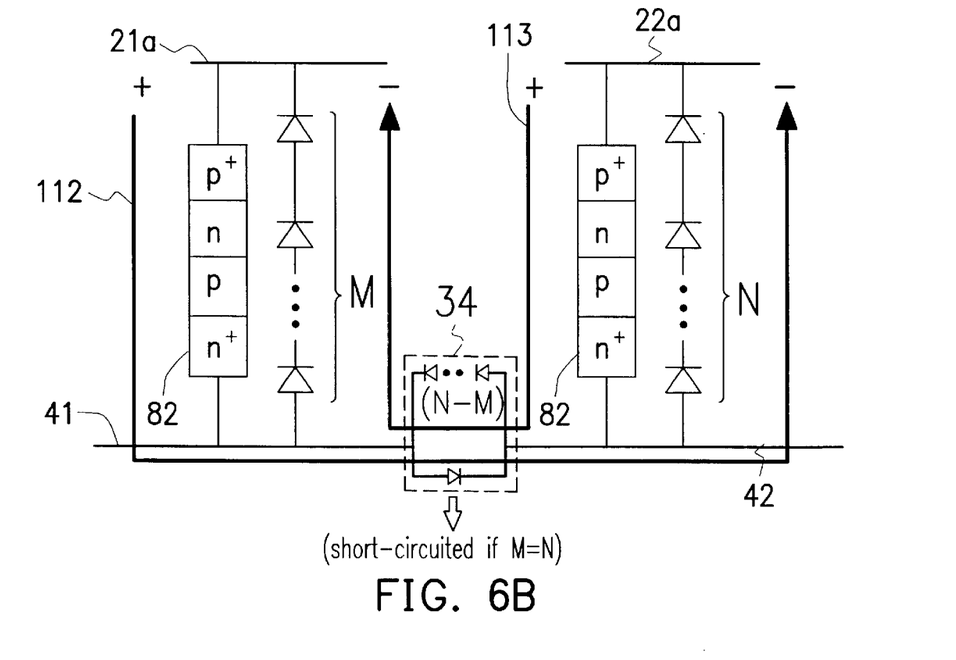

FIGS. 6A–6B are schematic diagrams used to depict how the ESD protection circuit of the invention would handle the condition of an ESD stress between one of the first set of bonding pads 21a, 21b, ..., 21n and one of the second set of bonding pads 22a, 22b, ..., 22n, for example between the bonding pads 21a and 22a. In FIGS. 6A–6B, the PMOS transistors 51a, 51b, ..., 51m are drawn as a set of serially-connected PN diodes designated by the reference numerals 81a, 81b, ..., 81m in FIG. 6A, herein the parasitic diode is formed by the substrate and the drain junction of PMOS transistor; while the SCR circuit (i.e., the combined circuit structure of the PNP transistor 53 and the NPN transistor 54) is drawn as a $p^+npn^+$ structure as designated by the reference numeral 82 in FIG. 6B.

When the $p^+npn^+$-based SCR circuit 82 is in the OFF state, the ESD-induced transient current would flow through the paths indicated by the arrows 110, 111 in FIG. 6A; and when switched OFF, the ESD-induced transient current would flow through the paths indicated by the arrows 112, 113 in FIG. 6B.

Under a positive ESD stress on bonding pad 21a, the ESD drainage path would be switched on if the voltage of bonding pads exceeds $M \cdot |V_{tp}| + N \cdot VD + VD$. Under normal operating conditions, $V_{dd1}$ should be smaller than $M \cdot |V_{tp}| N \cdot VD + VD$ so as to prevent the ESD protection circuit from being switched on. On the other hand, under a negative ESD stress on bonding pad 21a, the ESD drainage path would be switched on if the voltage of bonding pads exceeds $N \cdot |V_{tp}| + M \cdot VD + (N-M) \cdot VD$. Further, under normal operating conditions, it is required that $V_{dd2} < N \cdot |V_{tp}| + M \cdot VD + (N-M) \cdot VD$.

Figure 7A:
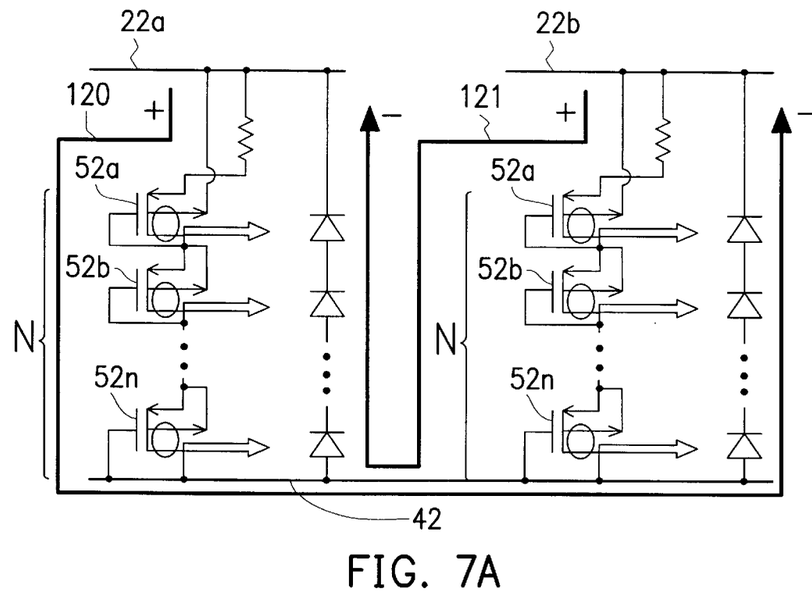
FIGS. 7A–7B are schematic diagrams used to depict how the ESD protection circuit of the invention would handle the condition of an ESD stress between a neighboring pair of the second set of bonding pads.
Figure 7B:
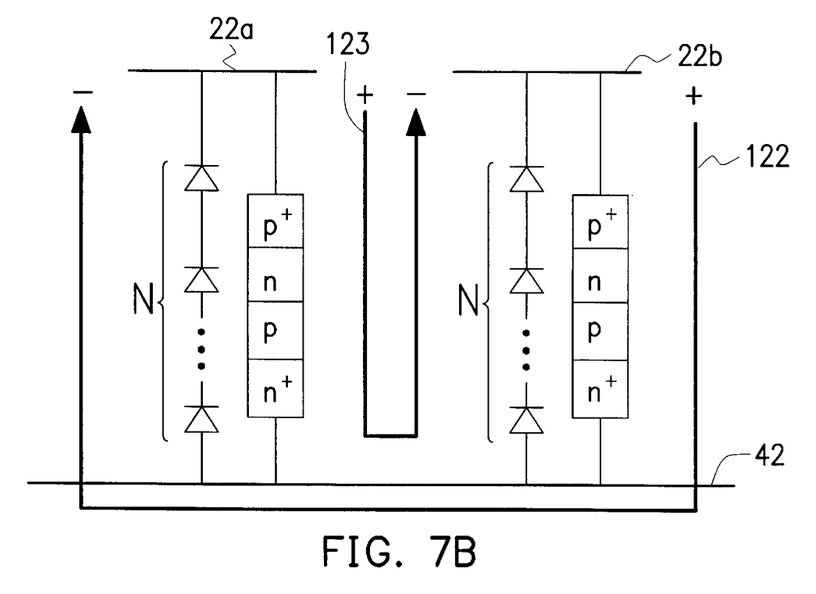

FIGS. 7A–7B are schematic diagrams used to depict how the ESD protection circuit of the invention would handle the condition of an ESD stress between a neighboring pair of the second set of bonding pads 22a, 22b, ..., 22n, for example between the bonding pads 22a and 22b. In FIGS. 7A–7B, the PMOS transistors 52a, 52b, ..., 52m are drawn as PN diodes, herein the parasitic diode is formed by the substrate and the drain junction of PMOS transistor, while the SCR circuit (i.e., the combined circuit structure of the PNP transistor 53 and the NPN transistor 54) is drawn as a p$^+$npn$^+$ structure.

When the p$^+$npn$^+$-based SCR circuit is in OFF state, the ESD-induced transient current would flow through the paths indicated by the arrows 120, 121 in FIG. 7A; and when switched on, the ESD-induced transient current would flow through the paths indicated by the arrows 122, 123 in FIG. 7B.

It can be seen that the path for a positive ESD-induced transient current and the path for a negative ESD-induced transient current are symmetrical. Under either condition, the triggering voltage for each ESD drainage path is $N \cdot |V_{tp}| + N \cdot VD$. Under normal operating conditions, this triggering voltage should be greater than $V_{dd2}$.

In accordance with the invention, the numbers M and N can be predetermined based on $V_{dd1}$ and $V_{dd2}$ to allow the ESD protection circuit to have a low triggering voltage and a low leakage current.

For example, in the case of 0.18 μm (micrometer) fabrication with $V_{dd1}$=1.8 V and $V_{dd2}$=3.3 V, the ESD protection circuit can be designed in such a manner that M=2 and N=3 with $V_{tp}$=−0.7 V, VD=0.4 V, and L=0.35 μm, where L is the PMOS channel length. Beside this, the invention is also suitable for use with the 0.15 μm, and even the 0.13 μm technology.

Figure 8:
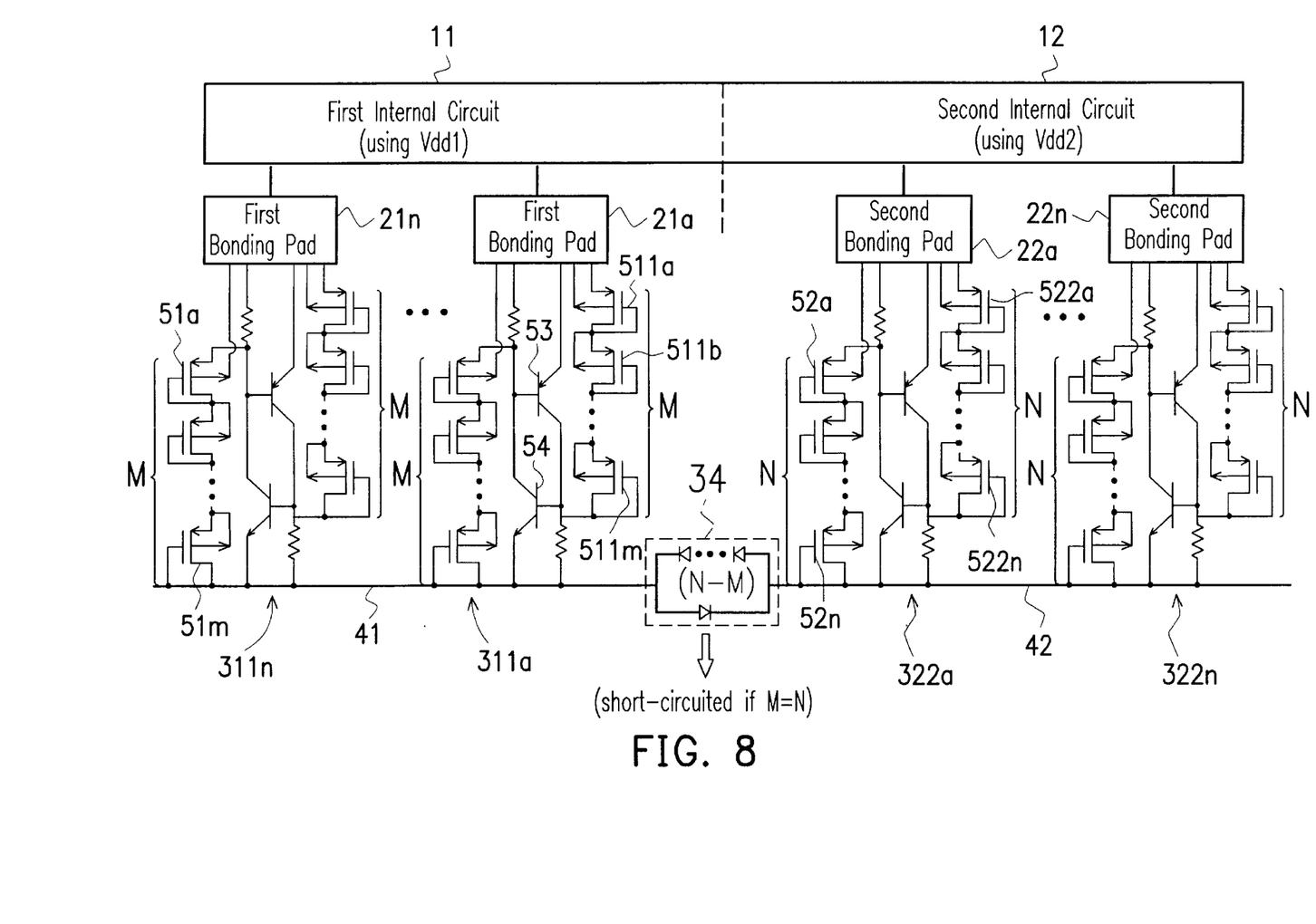
FIG. 8 is a schematic circuit diagram showing part of a second preferred embodiment of the ESD protection circuit according to the invention.

FIG. 8 shows a second preferred embodiment of the ESD protection circuit of the invention. This embodiment is a modification to the circuit shown in FIG. 4C; and in FIG. 8, those elements that are identical to those in FIG. 4C are labeled with the same reference numerals.

The circuit structure of FIG. 8 differs from that of FIG. 4C only in that the first set of ESD protection units (here designated instead by the reference numerals 311a, 311b, ..., 311n for distinguishing purpose) are parallel coupled with an additional set of M serially-connected PMOS transistors 511a, 511b, ..., 511m; while the second set of ESD protection units (here designated instead by the reference numerals 322a, 322b, ..., 322n for distinguishing purpose) are parallel coupled with an additional set of N serially-connected PMOS transistors 522a, 522b, ..., 522n.

In each of the first set of ESD protection units, for example the first ESD protection unit 311a, these M PMOS transistors 511a, 511b, ..., 511m are connected between the associated bonding pad 21a and the base of the NPN transistor 54. The PMOS transistors 511a, 511b, ..., 511m are each connected in such a manner that its gate is tied to its drain and connected to both the source and the substrate of the next PMOS transistor; for example, the first PMOS transistor 511a has its gate tied to its drain and connected to both the source and the substrate of the second PMOS transistor 511b; the second PMOS transistor 511b has its gate tied to its drain and connected to both the source and the substrate of the third PMOS transistor 511c; and so forth. Further, the last PMOS transistor 511m has its gate and drain connected to the base of the NPN transistor 54; and the first PMOS transistor 511a has its source and substrate connected to the associated bonding pad 21a.

In each of the second set of ESD protection units 322a, 322b, ..., 322n, these N PMOS transistors 522a, 522b, ..., 522n are connected in the same manner as each of the first set of ESD protection units 311a, 311b, ..., 311n.

The PMOS transistors 51a, 51b, ..., 51m in each of the first set of ESD protection units 311a, 311b, ..., 311n provide an additional ESD drainage path to each of the first set of ESD protection units 311a, 311b, ..., 311n. Similarly, the PMOS transistors 52a, 52b, ..., 52m in each of the second set of ESD protection units 322a, 322b, ..., 322n provide an additional ESD drainage path to each of the second set of ESD protection units 322a, 322b, ..., 322n. This allows the ESD protection circuit of this embodiment to have a double-triggering feature so that in the event of an ESD stress, the ESD protection circuit can be switched on faster than the previous embodiment.

In conclusion, the invention provides a novel ESD protection circuit with a low triggering voltage and a low leakage current for use with a multi-voltage power supply circuit to protect the internal circuitry of the multi-voltage power supply circuit against ESD stress. The invention is not only suitable for use with 0.18 μm technology, but also suitable for use with 0.15 μm or 0.13 μm technology, and nevertheless can provide a robust ESD protection capability to the associated IC device.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An ESD protection circuit for use with a multi-voltage power supply circuit having a first internal circuit using a first system voltage and a second internal circuit using a second system voltage, with the first internal circuit having a first set of bonding pads and the second internal circuit having a second set of bonding pads;

the ESD protection circuit comprising:
a first ESD bus;
a first set of ESD protection units each being coupled between the first ESD bus and one of the first set of bonding pads of the multi-voltage power supply circuit, and each of which is capable of being switched on in the event of an ESD stress to the associated one of the first set of bonding pads, wherein
the first set of ESD protection units each comprise:
a first resistor having a first end and a second end, with the first end being connected to a corresponding pad of the first set of bonding pads;

a second resistor having a first end and a second end, with the first end being connected to the first ESD bus;

a PNP transistor having a base connected to the second end of the first resistor, an emitter connected to a corresponding pad of the first set of bonding pads, and a collector connected to the second end of the second resistor;

an NPN transistor having a base connected to the second end of the second resistor, a collector connected to the second end of the first resistor, and an emitter connected to the first ESD bus;

a first PMOS transistor having a source connected to the second end of the first resistor, a substrate connected to a corresponding pad of the first set of bonding pads, a drain connected to the source of a subsequent PMOS transistor whereby a string of serially connected plurality of PMOS transistors are configured, and a gate connected to the drain;

a last PMOS transistor having a drain connected to the first ESD bus, a gate connected to the drain, a source connected to the drain of the second PMOS transistor, and a substrate connected to the source; and a predetermined number of transistors connected between the first and third PMOS transistors having a source connected to the drain of the preceding PMOS transistor, a drain connected to the source of the subsequent PMOS transistor, a gate connected to the drain, and a substrate connected to the source;

a second ESD bus;

a second set of ESD protection units each being coupled between the second ESD bus and one of the second set of bonding pads of the multi-voltage power supply circuit, and each of which is capable of being switched on in the event of an ESD stress to the associated one of the second set of bonding pads; and a routing circuit coupled between the first ESD bus and the second ESD bus, which allows an ESD-induced transient current in the first ESD bus to flow to the second ESD bus and an ESD-induced transient current in the second ESD bus to flow to the first ESD bus.

2. The ESD protection circuit of claim 1, wherein, in the case of M<N, where M is the total number of the PMOS transistors in each of the first set of ESD protection units and N is the total number of the PMOS transistors in each of the second set of ESD protection units, the routing circuit includes:

a plurality of serially-connected first diodes, the number of which is equal to N−M, having a positive end connected to the second ESD bus and a negative end connected to the first ESD bus; and a second diode connected in parallel to the serially-connected first diodes, having a positive end connected to the first ESD bus and a negative end connected to the second ESD bus.

3. The ESD protection circuit of claim 1, wherein, in the case of M=N, where M is the total number of the PMOS transistors in each of the first set of ESD protection units and N is the total number of the PMOS transistors in each of the second set of ESD protection units, the routing circuit is a short-circuit connected between the first ESD bus and the second ESD bus.

4. The ESD protection circuit of claim 1, wherein the first system voltage is smaller in magnitude than the second system voltage.

5. The ESD protection circuit of claim 1, wherein the first and second sets of bonding pads include a plurality of I/O pads.

6. The ESD protection circuit of claim 1, wherein the first and second sets of bonding pads include a plurality of power supply pads.

7. The ESD protection circuit of claim 1, wherein the first and second sets of bonding pads include a plurality of grounding pads.

8. An ESD protection unit, which comprises:

a first resistor having a first end and a second end, with the first end being connected to a bonding pad;

a second resistor having a first end and a second end, with the first end being connected to an ESD bus;

a PNP transistor whose base is connected to the second end of the first resistor, whose emitter is connected to the bonding pad, and a collector connected to the second end of the second resistor;

an NPN transistor having a base connected to the second end of the second resistor, a collector connected to the second end of the first resistor, and an emitter connected to the ESD bus;

a first set of PMOS transistors having a source connected to the second end of the first resistor, a substrate connected to a corresponding pad, and a drain connected to the source of the subsequent PMOS transistor whereby a string of serially connected plurality of PMOS transistors are configured, and a gate connected to a drain; a last PMOS transistor connected having a drain connected to the ESD bus, a gate connected to the drain, a source connected to the drain of the preceding PMOS transistor, and a substrate connected to the source; and a predetermined number of transistor connected between the first and last PMOS transistor having a source connected to the drain of the preceding PMOS transistor, a drain connected to the source of the subsequent PMOS transistor, a gate connected to the drain, and a substrate connected to the source.

9. The ESD protection unit of claim 8, further comprising:

a second set of PMOS transistors wherein a first PMOS transistor is connected having a source and substrate connected to the associated one of the second set of bonding pads, a gate connected to a drain, and a drain connected to the source of the subsequent PMOS transistor whereby a string of serially connected plurality of PMOS transistors are configured; a last PMOS transistor connected having a drain connected to the gate of the NPN transistor, a gate connected to the drain, a source connected to the drain of the preceding PMOS transistor, and a substrate connected to the source; and a predetermined number of transistors connected between the first and last PMOS transistor having a source connected to the drain of the preceding PMOS transistor, a drain connected to the source of the subsequent PMOS transistor, a gate connected to the drain, and a substrate connected to the source.

10. The ESD protection unit of claim 8, wherein the bonding pad is an I/O pad.

11. The ESD protection unit of claim 8, wherein the bonding pad is a power supply pad.

12. The ESD protection unit of claim 8, wherein the bonding pad is a grounding pad.

13. An ESD protection circuit for use with a multi-voltage power supply circuit having a first internal circuit using a first system voltage and a second internal circuit using a second system voltage, with the first internal circuit having a first set of bonding pads and the second internal circuit having a second set of bonding pads;

the ESD protection circuit comprising:

a first ESD bus;

a first set of ESD protection units each being coupled between the first ESD bus and one of the first set of bonding pads of the multi-voltage power supply circuit, and each of which is capable of being switched on in the event of an ESD stress to the associated one of the first set of bonding pads;

a second ESD bus;

a second set of ESD protection units each being coupled between the second ESD bus and one of the second set of bonding pads of the multi-voltage power supply circuit, and each of which is capable of being switched on in the event of an ESD stress to the associated one of the second set of bonding pads, wherein the second set of ESD protection units each comprise:

a first resistor having a first end and a second end, with the first end being connected to a corresponding pad of the second set of bonding pads;

a second resistor having a first end and a second end, with the first end being connected to the second ESD bus;

a PNP transistor having a base connected to the second end of the first resistor, an emitter connected to a corresponding pad of the second set of bonding pads, and a collector connected to the second end of the second resistor;

an NPN transistor having a base connected to the second end of the second resistor, a collector connected to the second end of the first resistor, and an emitter connected to the second ESD bus;

a first PMOS transistors having a source connected to the second end of the first resistor, a substrate connected to a corresponding pad of the second set of bonding pads, a drain connected to the source of the next PMOS transistor whereby a string of serially connected plurality of PMOS transistors are configured, and a gate connected to the drain; a last PMOS transistor connected having a drain connected to the second ESD bus, a gate connected to the drain, a source connected to the drain of the preceding PMOS transistor, and a substrate connected to the source; and a predetermined number of transistors connected between the first and last PMOS transistors having a source connected to the drain of the preceding PMOS transistor, a drain connected to the source of the subsequent PMOS transistor, a gate connected to the drain, and a substrate connected to the source; and a routing circuit coupled between the first ESD bus and the second ESD bus, which allows an ESD-induced transient current in the first ESD bus to flow to the second ESD bus and an ESD-induced transient current in the second ESD bus to flow to the first ESD bus.

14. The ESD protection circuit of claim 13, wherein, in the case of M<N, where M is the total number of the PMOS transistors in each of the first set of ESD protection units and N is the total number of the PMOS transistors in each of the second set of ESD protection units, the routing circuit includes:

a plurality of serially-connected first diodes, the number of which is equal to N−M, having a positive end connected to the second ESD bus and a negative end connected to the first ESD bus; and a second diode connected in parallel to the serially-connected first diodes, having a positive end connected to the first ESD bus and a negative end connected to the second ESD bus.

15. The ESD protection circuit of claim 13, wherein, in the case of M=N, where M is the total number of the PMOS transistors in each of the first set of ESD protection units and N is the total number of the PMOS transistors in each of the second set of ESD protection units, the routing circuit is a short-circuit connected between the first ESD bus and the second ESD bus.

16. The ESD protection circuit of claim 13, wherein the first system voltage is smaller in magnitude than the second system voltage.

17. The ESD protection circuit of claim 13, wherein the first and second sets of bonding pads include a plurality of I/O pads.

18. The ESD protection circuit of claim 13, wherein the first and second sets of bonding pads include a plurality of power supply pads.

19. The ESD protection circuit of claim 13, wherein the first and second sets of bonding pads include a plurality of grounding pads.

20. An ESD protection circuit for use with a multi-voltage power supply circuit having a first internal circuit using a first system voltage and a second internal circuit using a second system voltage, with the first internal circuit having a first set of bonding pads and the second internal circuit having a second set of bonding pads;

the ESD protection circuit comprising:

a first ESD bus;

a first set of ESD protection units each being coupled between the first ESD bus and one of the first set of bonding pads of the multi-voltage power supply circuit, and each of which is capable of being switched on in the event of an ESD stress to the associated one of the first set of bonding pads, wherein the first set of ESD protection units each comprise:

the ESD protection circuit of claim 1, wherein the first set of ESD protection units each comprise:

a first resistor having a first end and a second end, with the first end being connected to a corresponding pad of the first set of bonding pads;

a second resistor having a first end and a second end, with the first end being connected to the first ESD bus;

a PNP transistor having a base connected to the second end of the first resistor, an emitter connected to the associated one of the first set of bonding pads, and a collector connected to the second end of the second resistor;

an NPN transistor having a base connected to the second end of the second resistor, a collector connected to the second end of the first resistor, and an emitter connected to the first ESD bus;

a first set of PMOS transistors wherein a first PMOS transistor is connected having a source connected to the second end of the first resistor, a substrate connected to a corresponding pas of the first set of bonding pads, a drain connected to the source of the subsequent PMOS transistor whereby a string of serially connected plurality of PMOS transistors are configured, and a gate connected to the drain; a last PMOS transistor connected having a drain is connected the first ESD bus, a gate connected to the drain, a source connected to the drain of the preceding PMOS transistor, and a substrate connected to the source; and a predetermined number of transistor connected between the first and last PMOS transistors having a source connected to the drain of the preceding PMOS transistor, a drain connected to the source of the subsequent PMOS transistor, a gate connected to the drain, and a substrate connected to the source; and a second set of PMOS transistors wherein a first PMOS transistor has a source and substrate connected to a corresponding pad of the first set of bonding pads, a gate connected to a drain, and a drain connected to the source of the subsequent PMOS transistor whereby a string of serially connected plurality of PMOS transistors are configured; a last PMOS transistor connected to the gate of the NPN transistor, a gate connected to the drain, a source connected to the drain of the preceding PMOS transistor, and a substrate connected to the source; and a predetermined number of transistors connected between the first and last PMOS transistors having source connected to the drain of the preceding PMOS transistor, a drain connected to the source of the subsequent PMOS transistor, a gate connected to the drain, and a substrate connected to the source;

a second ESD bus;

a second set of ESD protection units each being coupled between the second ESD bus and one of the second set of bonding pads of the multi-voltage power supply circuit, and each of which is capable of being switched on in the event of an ESD stress to the associated one of the second set of bonding pads; and a routing circuit coupled between the first ESD bus and the second ESD bus, which allows an ESD-induced transient current in the first ESD bus to flow to the second ESD bus and an ESD-induced transient current in the second ESD bus to flow to the first ESD bus.

21. The ESD protection circuit of claim 20, wherein the first PMOS transistors are equal in number to the second PMOS transistors.

22. The ESD protection circuit of claim 20, wherein the first system voltage is smaller in magnitude than the second system voltage.

23. The ESD protection circuit of claim 20, wherein the first and second sets of bonding pads include a plurality of I/O pads.

24. The ESD protection circuit of claim 20, wherein the first and second sets of bonding pads include a plurality of power supply pads.

25. The ESD protection circuit of claim 20, wherein the first and second sets of bonding pads include a plurality of grounding pads.

26. An ESD protection circuit for use with a multi-voltage power supply circuit having a first internal circuit using a first system voltage and a second internal circuit using a second system voltage, with the first internal circuit having a first set of bonding pads and the second internal circuit having a second set of bonding pads;

the ESD protection circuit comprising:

a first ESD bus;

a first set of ESD protection units each being coupled between the first ESD bus and one of the first set of bonding pads of the multi-voltage power supply circuit, and each of which is capable of being switched on in the event of an ESD stress to the associated one of the first set of bonding pads;

a second ESD bus;

a second set of ESD protection units each being coupled between the second ESD bus and one of the second set of bonding pads of the multi-voltage power supply circuit, and each of which is capable of being switched on in the event of an ESD stress to the associated one of the second set of bonding pads, wherein the second set of ESD protection units each comprise:

a first resistor having a first end and a second end, with the first end being connected to the associated one of the second set of bonding pads;

a second resistor having a first end and a second end, with the first end being connected to the second ESD bus;

a PNP transistor having a base connected to the second end of the first resistor, an emitter connected to the associated one of the second set of bonding pads, and a collector connected to the second end of the second resistor;

an NPN transistor having a base connected to the second end of the second resistor, a collector connected to the second end of the first resistor, and an emitter connected to the second ESD bus;

a first set of PMOS transistors having a first PMOS transistor with a source connected to the second end of the first resistor, a substrate connected to a corresponding pad of the second set of bonding pads, a drain connected to the source of the subsequent PMOS transistor whereby a string of serially connected plurality of PMOS transistors are configured, and a gate connected to the drain; a last PMOS transistor connected having a drain is connected to the second ESD bus, a gate connected to the drain, a source connected to the drain of the preceding PMOS transistor, and a substrate connected to the source; and a predetermined number of transistors connected to the drain of the preceding PMOS transistor, a drain connected to the source of the subsequent PMOS transistor, a gate connected to the drain, and a substrate connected to the source; and a second set of PMOS transistors having a first PMOS transistor with a source and substrate connected to a corresponding pad of the second set of bonding pads, a gate connected to a drain, and a drain connected to the source of the subsequent PMOS transistor whereby a string of serially connected plurality of PMOS transistors are configured; a last PMOS transistor connected having a drain connected to the gate of the NPN transistor, a gate connected to the drain, a source connected to the drain of the preceding PMOS transistor, and a substrate connected to the source; and a predetermined number of transistors connected between the first and last PMOS transistor having a source connected to the drain of the preceding PMOS transistor, a drain connected to the source of the subsequent PMOS transistor, a gate connected to the drain, and a substrate connected to the source; and a routing circuit coupled between the first ESD bus and the second ESD bus, which allows an ESD-induced transient current in the first ESD bus to flow to the second ESD bus and an ESD-induced transient current in the second ESD bus to flow to the first ESD bus.

27. The ESD protection circuit of claim 26, wherein the first PMOS transistors are equal in number to the second PMOS transistors.

28. The ESD protection circuit of claim 26, wherein the first system voltage is smaller in magnitude than the second system voltage.

29. The ESD protection circuit of claim 26, wherein the first and second sets of bonding pads include a plurality of I/O pads.

30. The ESD protection circuit of claim 26, wherein the first and second sets of bonding pads include a plurality of power supply pads.

31. The ESD protection circuit of claim 26, wherein the first and second sets of bonding pads include a plurality of grounding pads.

* * * * *